US010254336B2

(12) United States Patent
Kusko et al.

(10) Patent No.: US 10,254,336 B2
(45) Date of Patent: *Apr. 9, 2019

(54) ITERATIVE N-DETECT BASED LOGIC DIAGNOSTIC TECHNIQUE

(71) Applicant: INTERNATIONAL BUSINESS MACHINES CORPORATION, Armonk, NY (US)

(72) Inventors: Mary P. Kusko, Hopewell Junction, NY (US); Gary W. Maier, Poughkeepsie, NY (US); Franco Motika, Hopewell Junction, NY (US); Phong T. Tran, Highland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/970,375

(22) Filed: May 3, 2018

(65) Prior Publication Data
US 2018/0252769 A1 Sep. 6, 2018

Related U.S. Application Data

(63) Continuation of application No. 15/010,591, filed on Jan. 29, 2016, now Pat. No. 10,024,910.

(51) Int. Cl.
G01R 31/317 (2006.01)
G01R 31/3177 (2006.01)
G01R 31/3183 (2006.01)

(52) U.S. Cl.
CPC ..... *G01R 31/31703* (2013.01); *G01R 31/3177* (2013.01); *G01R 31/31835* (2013.01); *G01R 31/318314* (2013.01)

(58) Field of Classification Search
None
See application file for complete search history.

(56) References Cited

U.S. PATENT DOCUMENTS

2017/0219651 A1 8/2017 Kusko et al.

OTHER PUBLICATIONS

List of IBM Patents or Patent Applications Treated as Related; (Appendix P), Filed May 3, 2018; pp. 1-2.

Primary Examiner — Justin R Knapp
(74) Attorney, Agent, or Firm — Cantor Colburn LLP; Steven Myers

(57) ABSTRACT

Techniques relate to an interactive logic diagnostic process. A diagnostic iteration loop is performed. When a critical failure does not have the diagnostic resolution that meets a predefined diagnostic resolution, potential faults related to the critical failure are isolated. When the critical failure has a diagnostic resolution that meets the predefined diagnostic resolution, the diagnostic iteration loop ends. Path focused fault test patterns are applied to the device under test in order to generate updated results of the path focused fault test patterns, such that the diagnostic resolution has been increased because a number of the potential faults related to the critical failure has decreased, and/or a size of a physical area of the potential faults related to the critical failure has decreased. The diagnostic iteration loop is returned to.

20 Claims, 12 Drawing Sheets

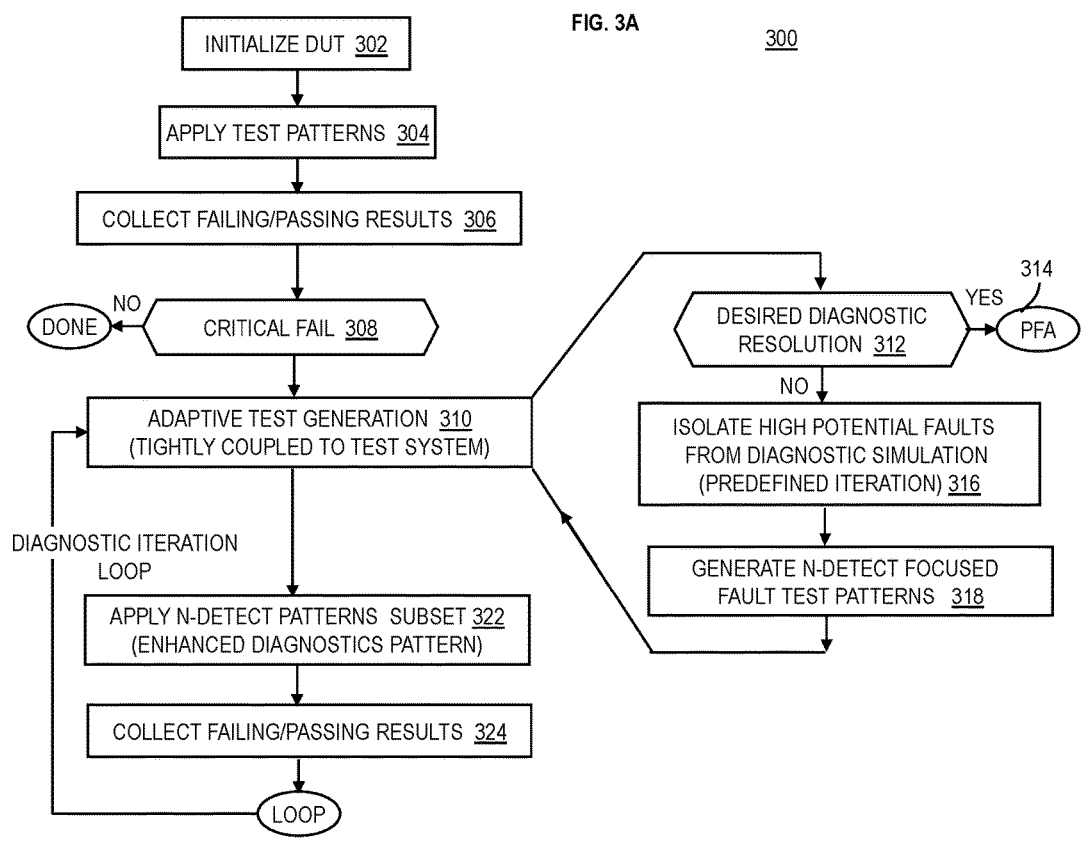

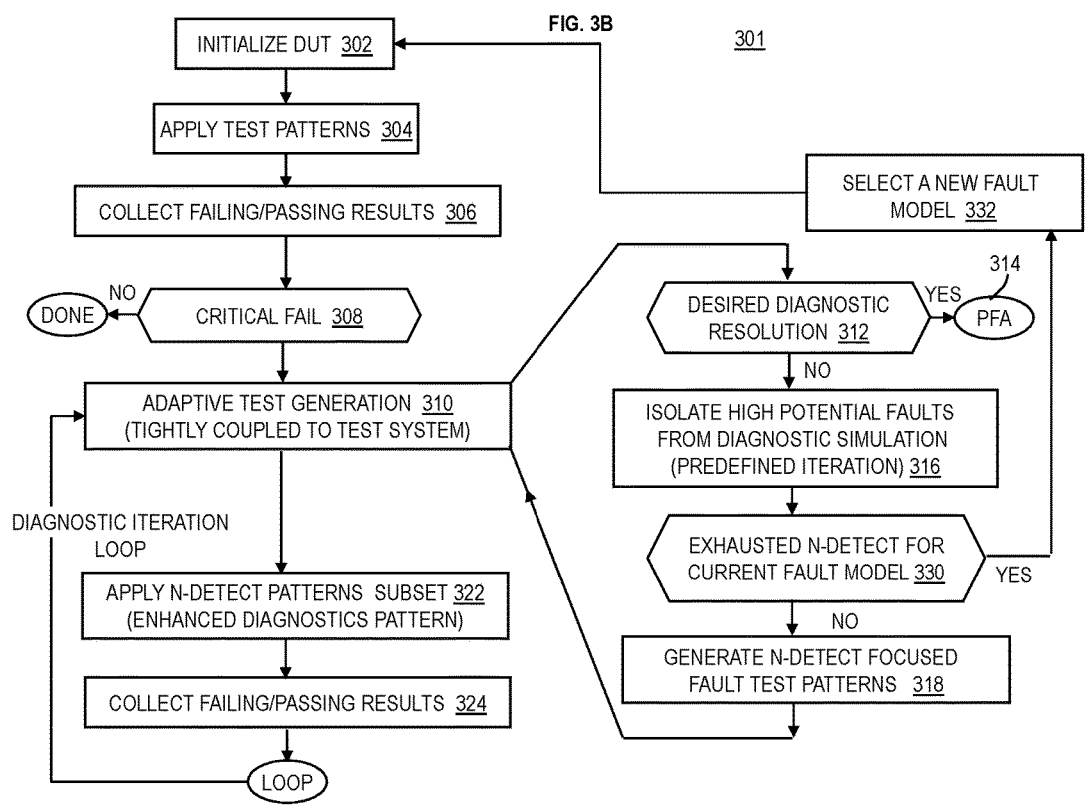

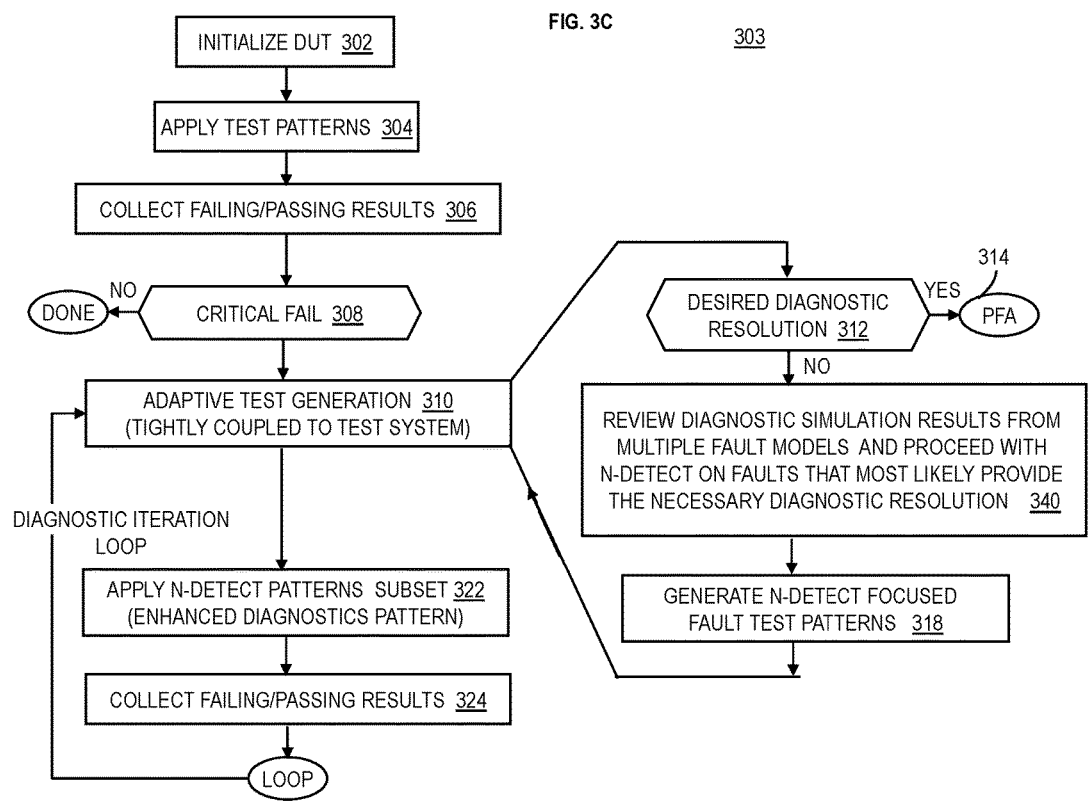

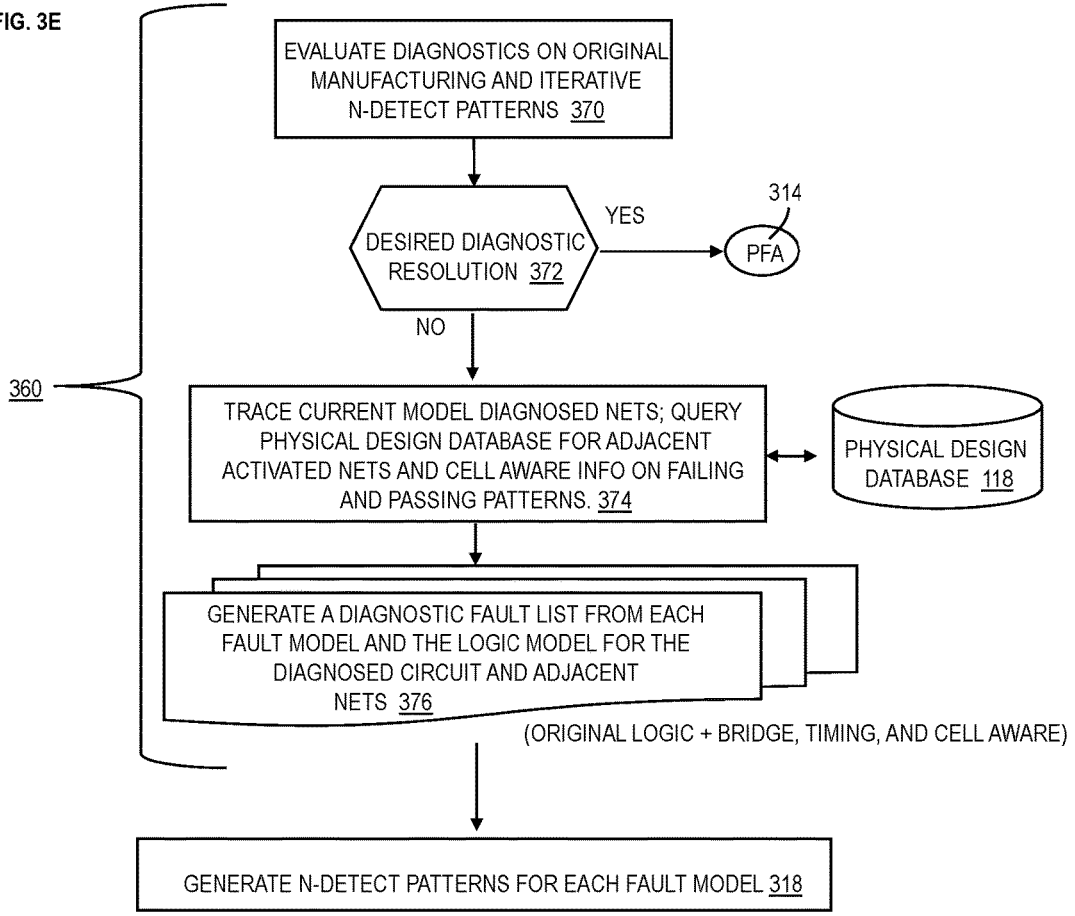

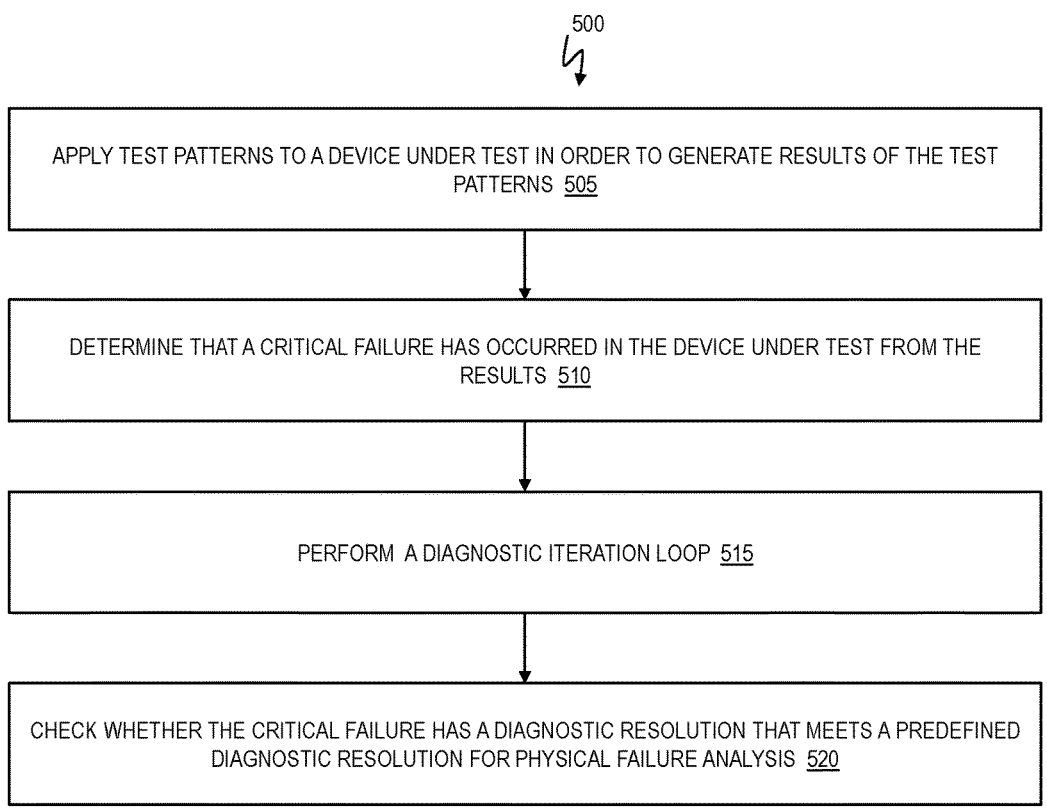

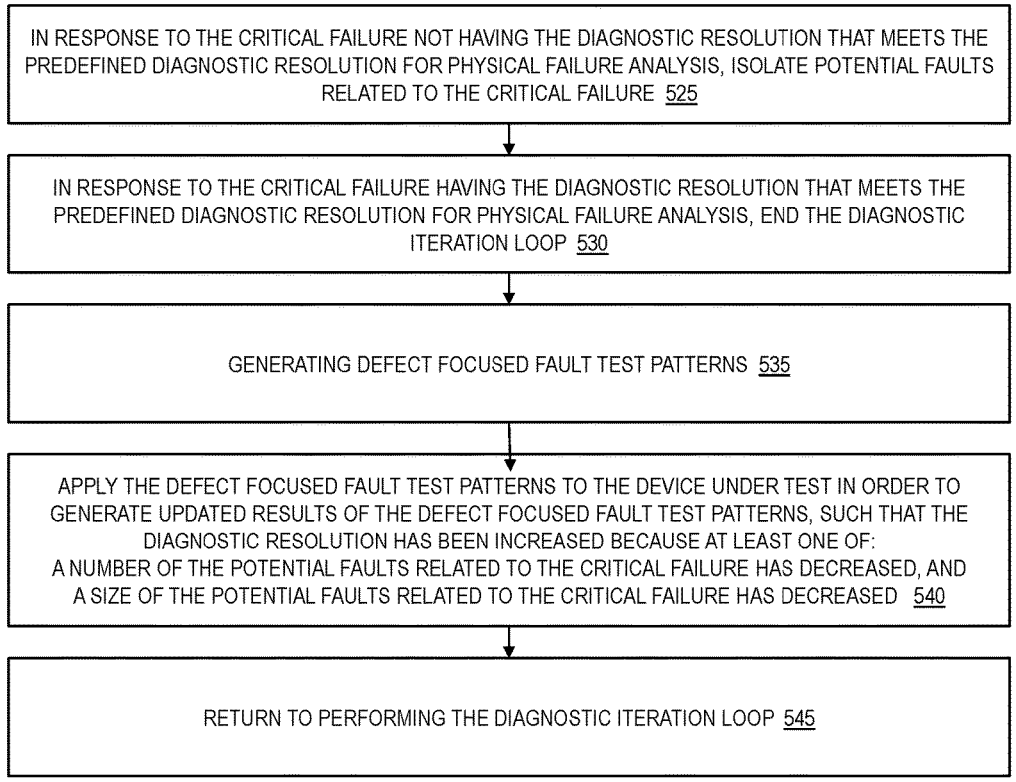

ITERATIVE N-DETECT BASED LOGIC DIAGNOSTIC TECHNIQUE

CROSS-REFERENCE TO RELATED APPLICATIONS AND DOMESTIC CLAIM

This application is a continuation of and claims priority from U.S. patent application Ser. No. 15/010,591 filed on Jan. 29, 2016, entitled "ITERATIVE N-DETECT BASED LOGIC DIAGNOSTIC TECHNIQUE", the entire contents of which are incorporated herein by reference.

BACKGROUND

The present invention relates generally to testing integrated circuits, and more specifically, to an iterative N-detect based logic diagnostic method.

A fault model is an engineering model of defects that occur in the fabrication of an integrated circuit, such as a microprocessor having numerous interconnected logic circuits. It is appreciated that many types of defects may be modeled in the fault model. Basic fault models in digital circuits may include the following. 1) The stuck-at fault model. A signal, or gate output, is stuck at a 0 or 1 value, independent of the inputs to the circuit. 2) The bridging fault model. Two signals are connected together when they should not be. Depending on the logic circuitry employed, this may result in a wired-OR or wired-AND logic function. 3) Transistor faults. This model is used to describe faults for complementary metal-oxide-semiconductor (CMOS) logic gates. At transistor level, a transistor maybe stuck-short or stuck-open. In stuck-short, a transistor behaves as it is always conducts (or stuck-on), and stuck-open is when a transistor never conducts current (or stuck-off). Stuck-short will produce a short between VDD (positive supply voltage) and VSS (negative supply voltage or ground). 4) The open fault model. Here a wire is assumed broken, and one or more inputs are disconnected from the output that should drive them. As with bridging faults, the resulting behavior depends on the circuit implementation. 5) The delay fault model, where the signal eventually assumes the correct value, but more slowly (or rarely, more quickly) than normal.

SUMMARY

Embodiments include a method, system, and computer program product for an interactive logic diagnostic process. Test patterns are applied to a device under test in order to generate results of the test patterns. A determination is made that a critical failure has occurred in the device under test from the results. A diagnostic iteration loop is performed, which comprises checking whether the critical failure has a diagnostic resolution that meets a predefined diagnostic resolution for physical failure analysis, and in response to the critical failure not having the diagnostic resolution that meets the predefined diagnostic resolution for physical failure analysis, isolating potential faults related to the critical failure. The diagnostic iteration loop comprises in response to the critical failure having the diagnostic resolution that meets the predefined diagnostic resolution for physical failure analysis, ending the diagnostic iteration loop. Further, the diagnostic iteration loop comprises applying the path focused fault test patterns to the device under test in order to generate updated results of the path focused fault test patterns, such that the diagnostic resolution has been increased because of at least one of a number of the potential faults related to the critical failure has decreased, and a size of a physical area of the potential faults related to the critical failure has decreased. Also, diagnostic iteration loop comprises returning to performing the diagnostic iteration loop.

BRIEF DESCRIPTION OF THE DRAWINGS

FIG. 3A is a flow chart of an adaptive fail device specific iterative process using a test feedback loop, occurring in FIGS. 2A, in accordance with an embodiment.

FIG. 3B is a flow chart of a modified adaptive fail device specific iterative process using a test feedback loop in accordance with an embodiment.

FIG. 3C is a flow chart of a modified adaptive fail device specific iterative process using a test feedback loop in accordance with an embodiment.

FIG. 3E is a flow chart of detailing an aspect in FIG. 3D in accordance with an embodiment.

FIGS. 5A and 5B together are a flow chart of a method for an interactive logic diagnostic process in accordance with an embodiment.

DETAILED DESCRIPTION

A problem often encountered in testing and subsequent diagnosis of very-large-scale integration (VLSI) devices is the availability of effective test pattern sets and precise diagnostic methodologies to pinpoint the root cause of a broad range of modeled and un-modeled faults. The rapid integration growth of these VLSI devices, associated high circuit performance and complex semiconductor processes, has intensified old and introduced new types of defects. This defect diversity and subtlety, accompanied by limited fault models, usually results in large and insufficient pattern sets with ineffective diagnostic resolution.

Identifying these faults and pinpointing the root cause of the problem in a large logic structure requires high resolution diagnostic calls to isolate the defect(s), and to successfully complete the Physical Failure Analysis (PFA) defect localization. The resolution of state-of-the-art logic diagnostic algorithms and techniques depend on the number of tests and the amount of passing and failing test result data available for each fault. Often state-of-the-art methods of generating test patterns and collecting associated test results are insufficient to achieve the desired diagnostic resolution. In addition, devices are getting larger and it becomes nearly impossible to apply patterns for 100% fault coverage due to limited tester memory. Hence a subset of patterns is generated to maybe achieve near 99% test coverage. The last percent coverage requires many more patterns and the test quickly becomes inefficient or too costly.

In this disclosure, embodiments provide an interactive and iterative test generation and diagnostic methodology that is based on specific device results resulting in high diagnostic resolution calls. Much smaller device regions are identified (as the fault) using results from previous tests and then regenerating patterns targeted to the problem region for PFA (Physical Failure Analysis) and yield learning.

Embodiments disclose a novel diagnostic and characterization method applicable to structural testing of logic designs. Embodiments address the problems of fault isolation and diagnostic resolution by providing an adaptive test algorithm and a tester interactive pattern generation method.

Figure 1:
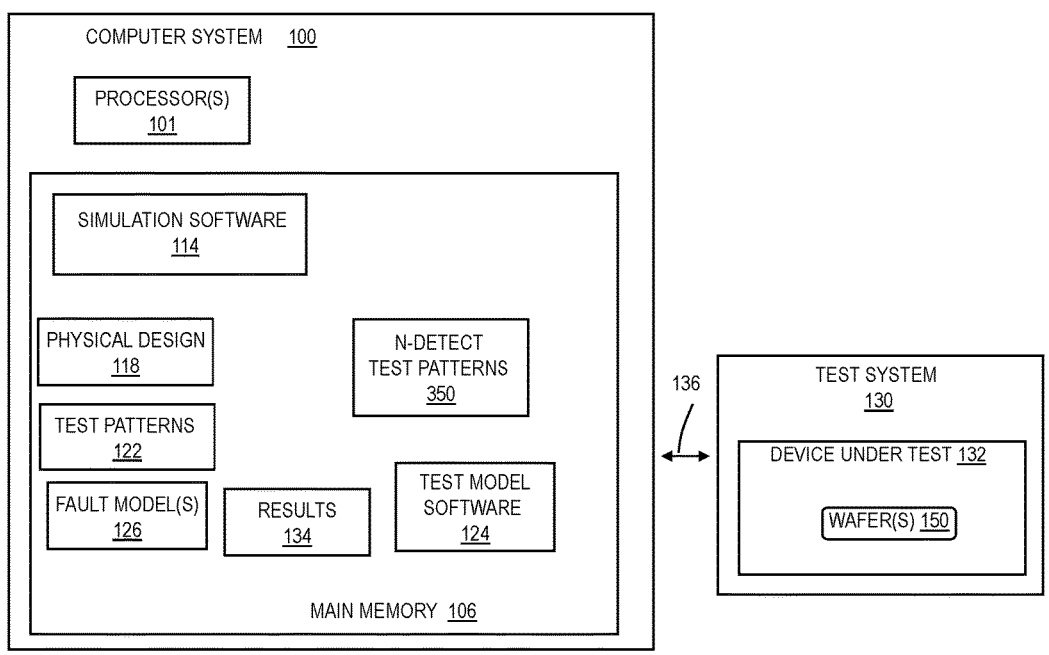
FIG. 1 depicts a computer system in accordance with an embodiment.
Figure 2A:
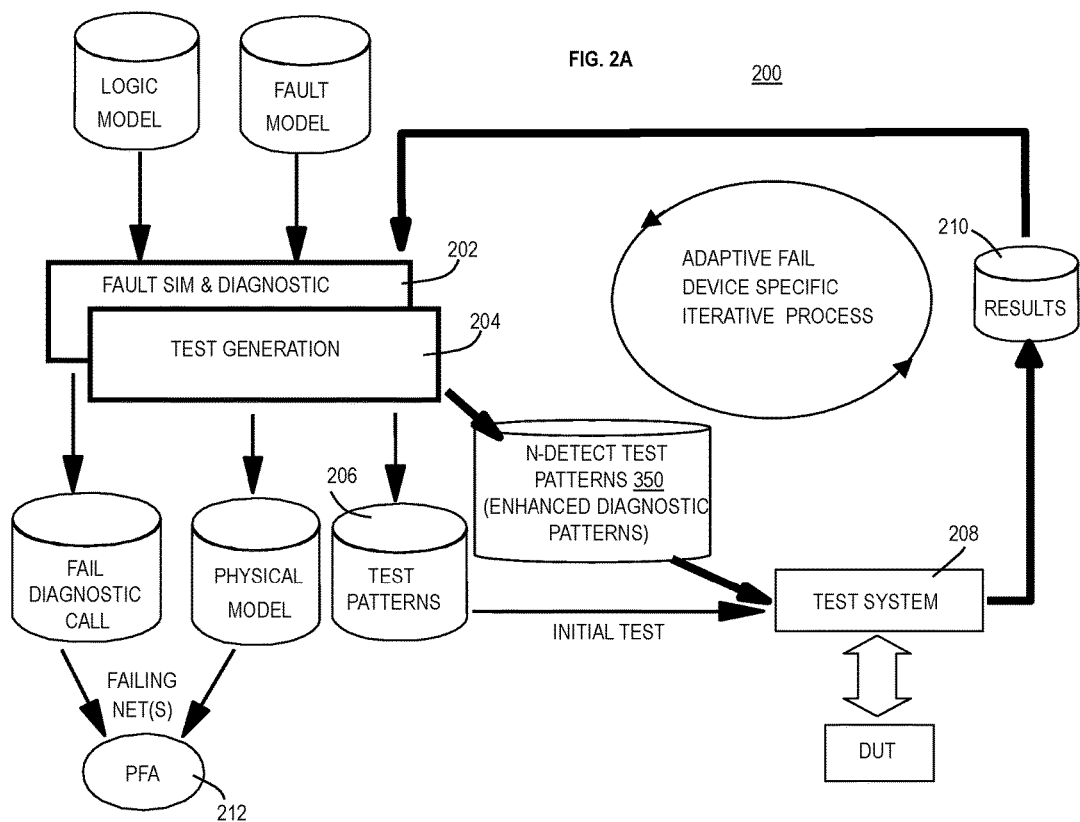
FIG. 2A depicts a high-level flow chart of an iterative diagnostic process in accordance with an embodiment.
Figure 2B:
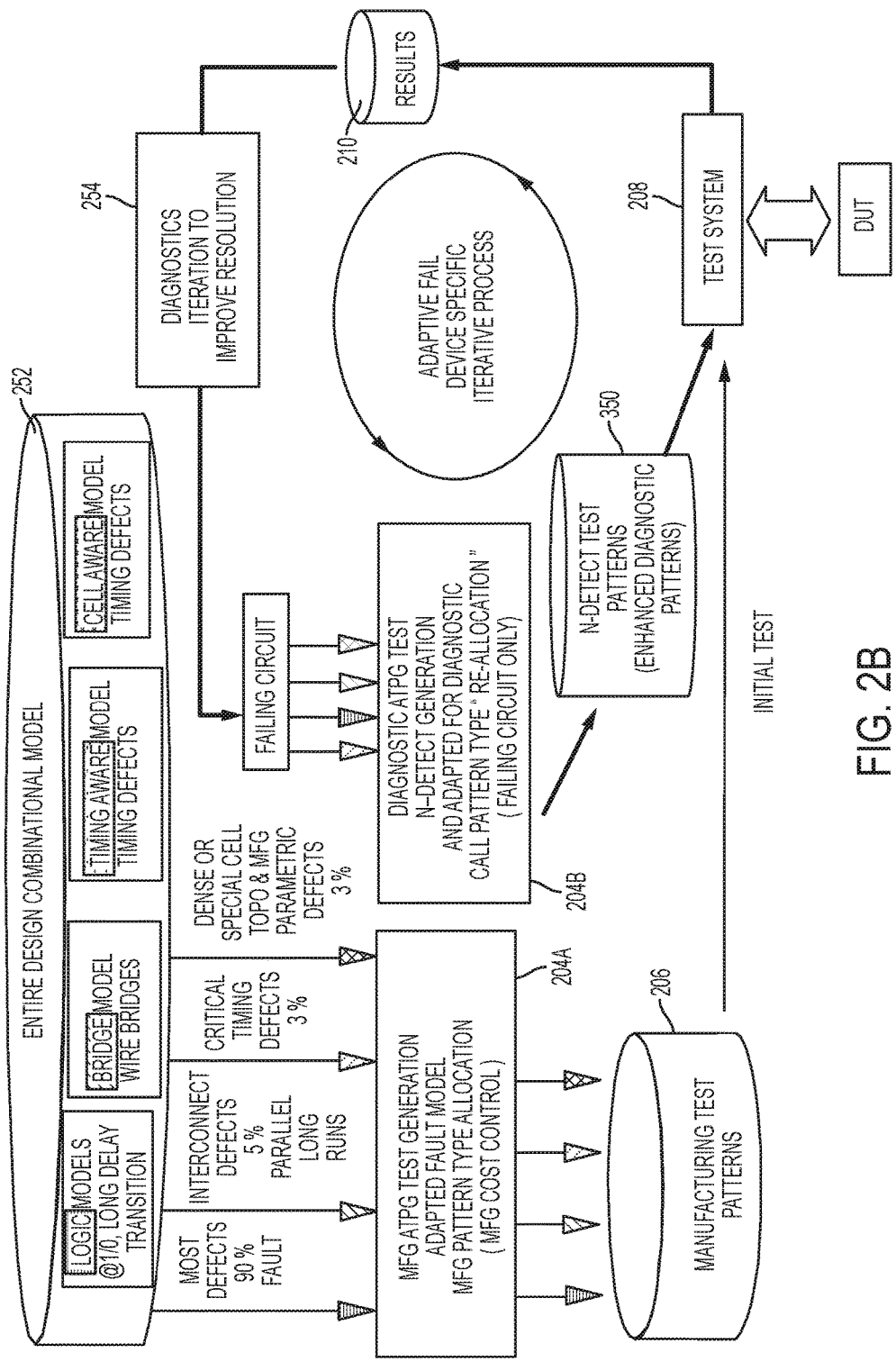
FIG. 2B depicts a high-level flow chart of an iterative diagnostic process in accordance with an embodiment.
Figure 3D:
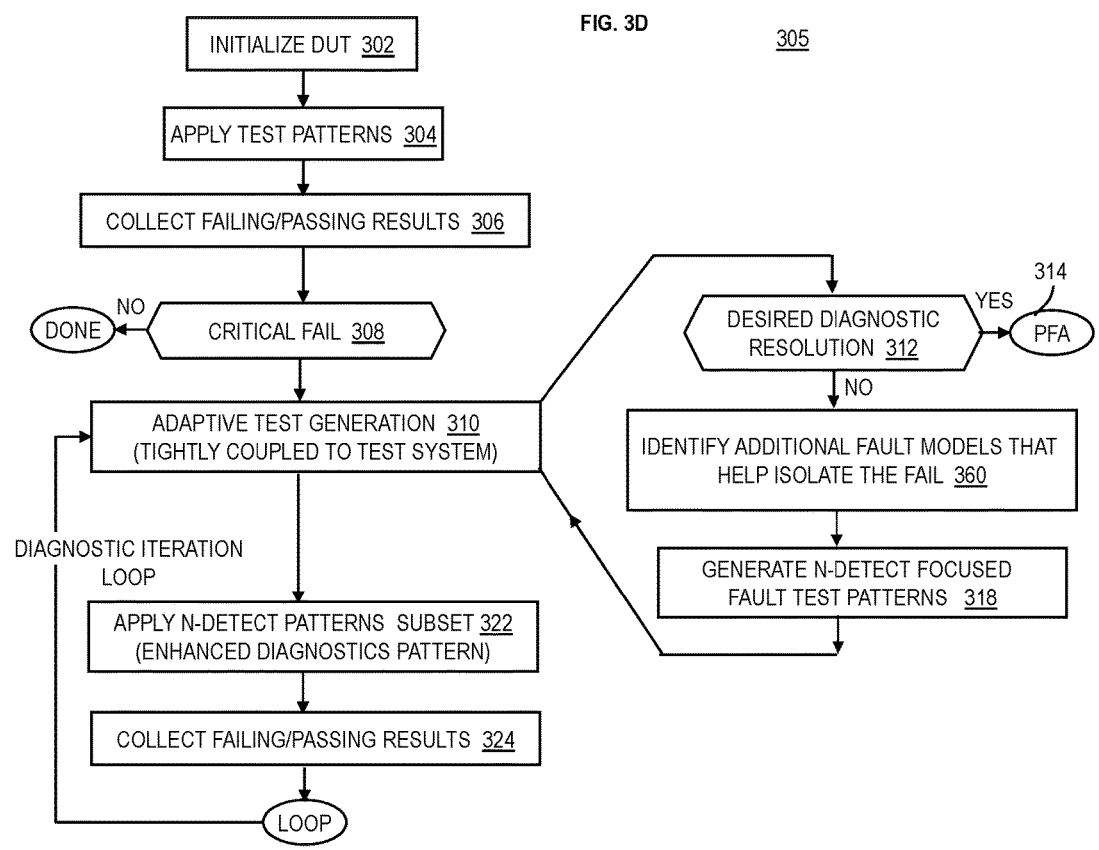
FIG. 3D is a flow chart of a modified adaptive fail device specific iterative process using a test feedback loop in accordance with an embodiment.
Figure 4:
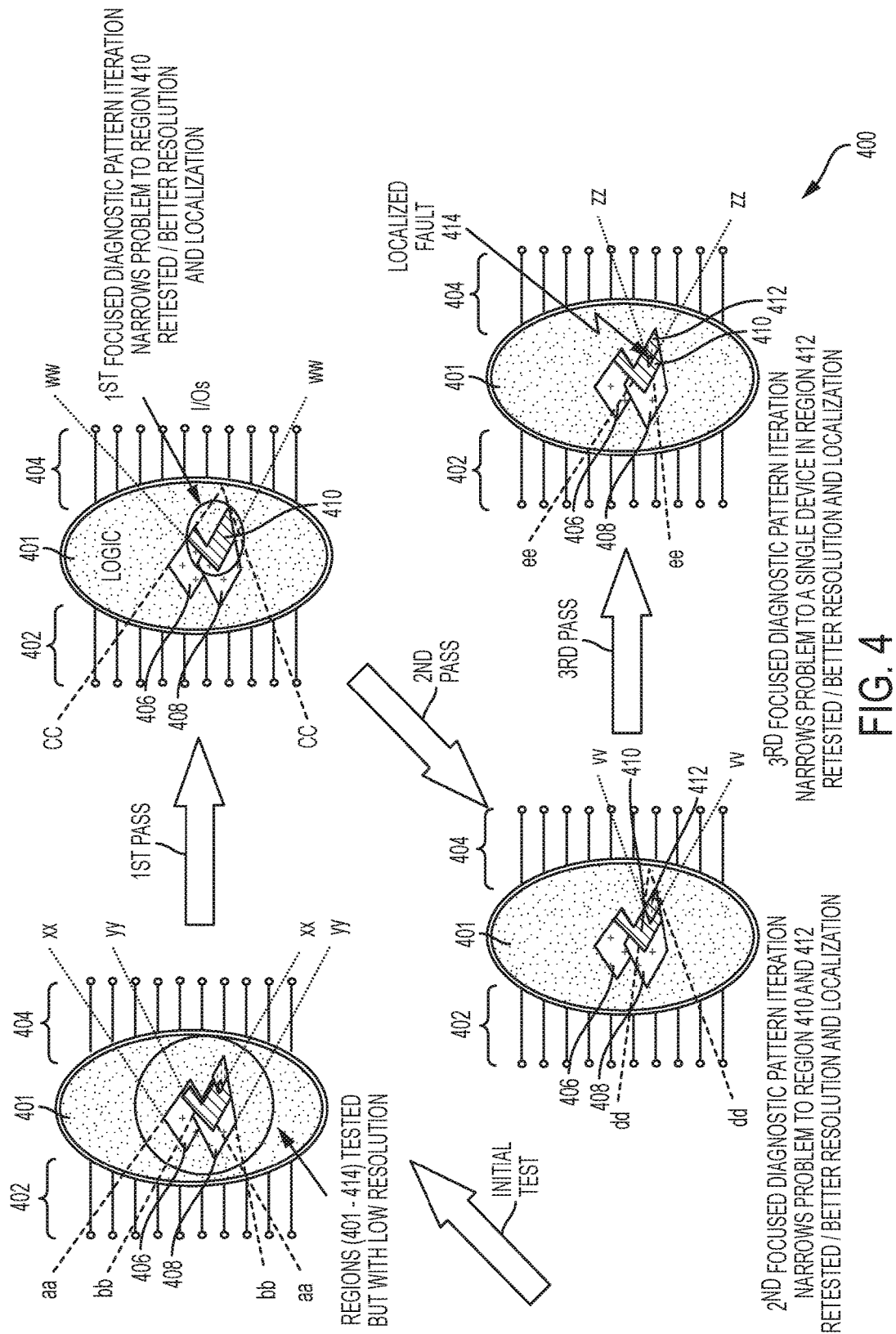
FIG. 4 depicts fault localization given multiple perturbed failing pattern results according to the adaptive fail device specific iterative process in FIGS. 2A, 2B, and 3A-3E in accordance with an embodiment.

Turning now to FIG. 1, a computer system 100 is generally shown according to an embodiment. Computer system 100 includes a processor 101 that is in communication with a main memory 106. The processor 101 executes applications such as simulation software 114 and test model software 124 that are stored in main memory 106. FIG. 2A depicts a high-level flow chart 200 of an iterative diagnostic process according to an embodiment, and FIG. 2B is a modified version of the flow chart in FIG. 2A. FIG. 3A is a flow chart 300 of further details of an adaptive fail device specific iterative process using a test feedback loop, which occurs in FIGS. 2A and 2B, according to an embodiment. FIGS. 3B, 3C, and 3D are modified versions of the flow chart in FIG. 3A according to an embodiment, and FIG. 3E further illustrates details of FIG. 3D according to an embodiment. FIG. 4 depicts fault localization given multiple perturbed failing pattern results based on using the adaptive fail device specific iterative process in FIGS. 2A, 2B, and 3A-3E according to an embodiment. FIG. 4 also illustrates multiple pass failure overlap and localization. The computer system 100 in FIG. 1 may be utilized in FIGS. 2A, 2B, 3A-3E, and 4.

There is a completed physical design 118 for an integrated circuit (IC) (e.g., a chip) on the wafer 150, and the physical design 118 may be in a manufacturing mask shapes database. The physical design 118 is released to the manufacturing fabrication (Fab) plant in which the manufacturing fabrication plant builds the actual product from the physical design 118. The product is the integrated circuit on the wafer 150 according to the physical design 118. There may be numerous integrated circuits on a wafer, and each integrated circuit may be diced into an individual chip.

Referring to FIGS. 1 and 2A, at block 202, the simulation software 114 (e.g., fault simulation and diagnostics software) may utilize or receive input of the fault model 126 and a logic model as part of the simulation. The logic model represents the logic gates or logic devices in the physical design 118. Also, at block 204, test model software 124 may utilize or receive input of the fault model 126, the logic model, and/or the simulation software 114.

This test model 124 is the logical equivalent model that is used to generate test patterns 122 to test the entire physical design 118. Once the test model 124 is built to replicate the physical design 118, a list of faults for a fault model 126 is generated which includes all of the gate inputs and outputs used in the physical design 118. Example gates include AND, NAND, OR, NOR, etc., in some cases, direct current faults are targeted first, such as stuck at 0 or stuck at 1 on the inputs or outputs to a gate or a wire connected to the gate.

Items like wires, called nets, can be shorted to other nets, or the wires can be open. More complex faults are also modeled in the fault model 126 such as resistive shorts to other nets. These types of faults may not behave like a dead short causing a stuck at 1 or 0. Instead, resistive shorts may only behave as a short under certain environmental or test conditions, such as high temperature and high voltage where the resistive short becomes less resistive and then gets stuck at 0 or 1 intermittently. The test model 124 can create complex faults (in the fault model 126) that can be modeled using a range of devices sizes and drive strengths.

At block 206, the test model software 124 is configured to generate test patterns 122 for a test system 130. The test patterns 122 are passed to the test system 130 as part of the initial test pass, and the test system 130 runs the test patterns 122 on a device under test (DUT) 132, at block 208. The device under test 132 is the wafer 150 having the integrated circuit. The test patterns 122 are run by the test system 130 in attempt to cause a fail according to the fault model 126. At block 210, the fails are collected as fail data test results 134.

The test results 134 are passed back to the simulation software 114 and the test model software 124.

It is assumed that the fail test results 134 had the desired diagnostic resolution. In this case, after the test system 130 runs the test on the wafer 150, the simulation software 114 performs fault diagnostics (based on the (latest) fail test results 134) to determine where the faults in the wafer 150 are located. The location information of faults found on wafer 150 is stored in a fault localization database to be passed to physical failure analysis (PFA) at block 212. A fail diagnostic call and the physical design/model 118 are provided for physical failure analysis (PFA). The fail diagnostic call is the identification of the location of the fault(s) on the integrated circuit of wafer 150 (i.e., coordinate identification of the fault on the DUT 132). The physical design/model 118 is a design of the physical layout of the integrated circuit on the wafer 150 (i.e., DUT 132), and the physical design/model 118 provides the detail for the semiconductor fabrication plant (i.e., FAB) to manufacture the integrated circuit as understood by one skilled in the art. During physical failure analysis, the integrated circuit on the wafer 150 is taken apart layer by layer to identify the location of the faults according to the fault location information from the simulation software 114 based on the latest test results 134.

It is assumed that the fail test results 134 did not have the desired diagnostic resolution. In this case, the test model software 124 generates N-detect test patterns 350 that are based on the potential/general location of the faults in the fail test results 134. The test model software 124 uses and/or causes the test system 130 to apply a subset of the N-detect test patterns 350 to be applied to the device under test 132 (i.e., wafer 150). After the test patterns 122 are run by the test system 130 to reduce the number of faults and/or reduce the area (i.e., physical space of the fault(s) on the wafer 150) of the faults (at block 208), the fails are again collected as updated fail data test results 134. The test results 134 are passed back to the simulation software 114 and the test model software 124.

Again, the simulation software 114 performs fault diagnostics (based on the (latest) fail test results 134) to determine where the faults in the wafer 150 are located. The test model software 124 checks the simulation results of the simulation software 114 to determine if the location information of faults after using the N-detect test patterns 350 has now been reduced to a predefined number of faults and/or predefined area size of the faults (i.e., physical space of the fault(s) on the wafer 150 that is small enough for PFA). If the desired diagnostic resolution was found, the flow proceeds to PFA as discussed above. If the desired diagnostic resolution was not found, the test model software 124 iterates the process using another subset of the N-detect test patterns 350.

The test model software 124 may include and/or utilize Automatic Test Pattern Generator (ATPG) which is an electronic design automation method/technology used to find an input (or test) sequence that, when applied to a digital circuit, enables automatic test equipment to distinguish between the correct circuit behavior and the faulty circuit behavior caused by defects.

FIG. 2B is a modified version of FIG. 2A. In FIG. 2B, an entire design combination model 252 is provided. The design combination model 252 includes logic models (such as, e.g., long delay transition, etc.), as well as fault models representing different defects that could occur in the logic model. Example faults models may include a bridge fault model (for detecting wire bridges), a timing aware fault model (for detecting timing defects), and a cell aware model (for detecting timing defects). The fault model 126 may include various types of fault models.

At block 204A, manufacturing ATPG Test Generation is performed for the adapted fault model and manufacturing pattern type allocation is performed. For example, ATPG Test Generation is performed to generate the set of patterns 122 for manufacturing test. Adapted fault models are used in the generation. There is finite tester memory (in the test system 130) and limited tester time so the test patterns 122 are optimized for the needs of the DUT.

At block 206, the manufacturing test patterns 122 are passed to the test system, and the test system 130 applied the manufacturing test patters 122 to the device under test 132 at block 208. At block 210, the test results 134 are passed to the simulation software 114, and the simulation software 114 performs diagnostics iteration to improve resolution at block 254.

At block 204B, for a fault representing a failing circuit, diagnostic ATPG test N-detect generation is performed and adapted for diagnostic call pattern type "re-allocation". For example, an N-detect diagnostic set of ATPG test patterns 350 are generated. The fault model used is adapted from the diagnostics data collected to date. For example, if there is a timing related fail then a transition fault model can be used targeting only the localized region.

The N-detect test patterns 350 have been generated specific to the failing circuit only, such that the N-detect test patterns 350 are applied to the DUT 132 by the test system at block 208.

FIG. 3A provides further details of FIG. 2A (along with FIG. 2B). In FIG. 3A, the flow follows the adaptive fail device specific iterative process using a test feedback loop in the flow chart 300. In one implementation, the test system 130 and the computer system 100 may be two separate devices that are connected together to work in conjunction as discussed herein. In another implementation, the computer system 100 and the test system 130 may be a single device that is integrated to work as discussed herein.

Referring to FIG. 3A, the test system 130 initializes the device under test 132 (e.g., the wafer 150 having the integrated circuit) at block 302. At block 304, the test system 130 applies standard test patterns 122 to the device under test 132. At block 306, the test system 130 collects the passing and failing test results 134, which are passed to the test model software 124. The test model software 124 is configured to determine whether there is a critical fail in the test results 134 at block 308. A critical fail/failure is determined if it was previously not discovered and it happens in a region cross-section in a reasonable localized cone of logic. If there is no critical fail (no further new fails in this localized cone of logic), the flow ends. In one implementation, a critical fail is one where the diagnostic resolution is not precise enough (as predefined) for PFA, because the suspect region (i.e., area size of the location of the fault(s) on the wafer 150) is too large. The test model software 124 is configured to recognize that the diagnostic resolution is small enough (e.g., reaches a predefined size of area on the wafer 150) so PFA can be performed with a high degree of confidence (as discussed further below).

If there is a critical fail, the test model software 124 is configured to perform the adaptive test generation at block 310. The adaptive test generation is tightly coupled to the test system 130, which means higher resolution, more complex, and a larger set a patterns can be generated to retest and collect diagnostic data on this smaller localized logic region.

At block 312, the test model software 124 is configured to determine if the predefined (desired) diagnostic resolution is found for failures/faults in the test results 134. In one implementation, this may be determined by comparing the diagnostic simulation result (from the simulation software 114) to the original test model fault list (in one or more fault models 126) used to generate the patterns previously run on the tester 130. If the diagnostic fault call is in the original fault list, the desired fault resolution is found, and the flow outputs the fail diagnostic call and physical model/design 118 to the physical fail analysis at block 314.

It should be appreciated that sufficient (predefined) diagnostic resolution may vary with the PFA capabilities. Diagnostic resolution narrows down the fail to a physical area. This area has to fit the spatial needs of the PFA capabilities in use at the time. For example, it is assumed that PFA capabilities need the suspect defect area narrowed down to a 100×100 micron region. If there are two defects called out and the suspect region of fail is 500×500 microns, this is too big and the failures/faults in the test results 134 do not meet the predefined diagnostic resolution. However, if the two defects called out have a suspect region that is 90×90 microns, the test model software 124 determines that the predefined diagnostic resolution is met for the faults. If yes the predefined diagnostic resolution is found in the test results 134, the test model software 124 is configured to output the fail diagnostic call and physical model/design 118 to the physical fail analysis at block 314.

If no the predefined diagnostic resolution is not found in the test results 134, the test model software 124 is configured to isolate high potential faults in the test results 134 at block 316. The test model software 124 may utilize a predefined iteration to isolate the high potential faults at block 316. In one implementation, the test model software 124 may apply weights to certain potential faults and the potential faults with the higher weights are isolated. The weighted or higher potential fault are ones that narrow the problem down to a common path or device and/or narrow the problem down to a single or common fault for all previously tested faults. High potential faults can present themselves in different ways. In one implementation, a typical diagnostic simulation (by the simulation software 114) for each suspect fault has a score associated with it. A 100 score means the simulation software 114 can exactly explain the fault. A low score of 10 means it is unlikely the simulation software 114 can explain the fault. High Potential faults are the set of faults with a high score. As an example, this parameter for high potential faults may be set such that any fault with a score greater than 75 is to be used. Perhaps, for the first pass, the test model software 124 may be configured to utilize any potential fault with a score of 75 or greater, and in the next iteration (of the N-detect test patterns), the test model software 124 may be configured to utilize any potential fault with a score of 85 or above. The threshold score, used by the test model software 124 for which potential fault use (isolate), is a variable for each iteration. Additionally, if the test model software 124 is not narrowing down the faults sufficiently, the loop may be repeated with a lower or higher score.

At block 318, the test model software 124 is configured to generate N-detect focused fault test patterns 350. The N-detect focused fault test patterns 350 are enhanced diagnostic test patterns that are focused on fault detection paths for the identified faults. The N-detect focused test patterns 350 use different fault detection paths to test the same fault.

At block 322, the test system 130 is configured to test the device under test 132 (i.e., wafer 150) by applying a subset of the N-detect focused fault test patterns 350.

At block 324, the test system 130 and/or the test model software 124 acquires the pass and failing test results 134. The diagnostic loop continues such that the test model software 124 is configured to determine whether the latest test results 134 have the predefined diagnostic resolution at block 312. The desired diagnostic resolution may be found when the number of faults and/or the area of the faults (i.e., physical space of the fault(s) on the wafer 150) have been reduced to a predefined size, after applying the N-detect patterns 350.

There can be a first pass through the diagnostic iteration loop through a last pass, based on meeting the predefined diagnostic resolution.

Further, the diagnostic algorithm of FIG. 3A may be based on identifying high confidence logic nets using standard diagnostic techniques in block 316. These identified nets have a high probability of being involved in the initial failing results surfaced by the standard test patterns 122. Once these nets are identified, the test model software 124 is configured to generate a new set of N-detect test patterns 350 that target the modeled and un-modeled faults in these nets. The N-detect test patterns 350 can be based on multiple perturbations of the initial test patterns. This new set of N-detect test patterns 350, generated dynamically by the test model software 124, by the test system 130, and/or by fault simulation extension of the fault model 126, are then applied to the failing device under test 132 via the test system 130. The additional failing data 134 from these new N-detect focused patterns 350 are used to further improve the diagnostic call. This adaptive test algorithm and tester interactive pattern generation process in flow 300 is then iterated to achieve the desired diagnostic call resolution. The process can be further enhanced by implementing the concept in a tightly coupled dynamic pattern generation and execution at the test system 130.

To narrow and better isolate these common devices or paths, one example of the new diagnostic N-detect pattern iterations may include, e.g., more complex faults such as changing device strengths, reducing wire and insulation resistance, reducing wire and insulation capacitance, and/or making sure the test pattern is driving two adjacent aggressor nets with the opposite value of a surrounded victim net that is trying to drive an opposite value. These are just a few scenarios of some more complex faults that may not be previously modeled. This can cause a diagnostic simulation to not properly isolate a fault using fail data generated from the first set of patterns created from the basic test model and an incomplete fault list. One or more embodiments of these N-detect patterns is to modify fault behavior with many scenarios including these possible complex faults on the "partially isolated" logic devices and nets called out by the first fail data to see if it can improve the fault localization. If it can, it considers this a critical fail and will generate new patterns with these scenarios to collect new data to verify the fault is effectively isolated and all the previous and new failing patterns are explained by this single high resolution complex fault.

According to an embodiment, FIG. 3B depicts a flow chart 301 of the adaptive fail device specific iterative process using a test feedback loop, and FIG. 3B is a modification of the flow in FIG. 3A. FIG. 3B includes elements of FIG. 3A, and description of these identical elements is not repeated. FIG. 3B includes block 330 in which the test model software 124 now checks whether the N-detect fault detection paths are exhausted for the current fault mode. For example, the test model software 124 may cause various subsets of the N-detect test patterns 350 to be run (on the DUT 132) such that no more fault detection paths are left. If there are more N-detect test patterns 350 to be applied to the DUT 132, the flow proceeds to block 318. If there are not any more N-detect test patterns 350 to be applied, the test model software 124 is configured to select a new fault model at block 332, and the flow proceeds to block 302 using the new fault model.

According to an embodiment, FIG. 3C depicts a flow chart 303 of the adaptive fail device specific iterative process using a test feedback loop, and FIG. 3C is a modification of the flow in FIG. 3A. FIG. 3C includes elements of FIG. 3A, and description of these identical elements is not repeated. FIG. 3C includes block 340 in which the test model software 124 now reviews diagnostic simulation results (generated by the simulation software 114) from multiple fault models 126 and proceeds with N-detect test patterns 350 on faults that most likely (i.e., meeting a predefined probability) provide the necessary diagnostic resolution. In one implementation, the test model software 124 picks one fault model 126 based on inline data from the manufacturer (FAB), based on timing information, etc. Flow proceeds to block 318.

According to an embodiment, FIG. 3D depicts a flow chart 305 of the adaptive fail device specific iterative process using a test feedback loop, and FIG. 3D is a modification of the flow in FIG. 3A. FIG. 3D includes elements of FIG. 3A, and description of these identical elements is not repeated. FIG. 3D includes block 360 in which the test model software 124 now identifies additional fault models 126 that help isolate the fail/fault. FIG. 3E further details the process of identifying additional fault models of block 360.

Referring to FIG. 3E, the test model software 124 is configured to evaluate diagnostics on original manufacturing and iterative N-detect test patterns at block 370. At block 372, the test model software 124 checks whether the desired diagnostic resolution is sufficient. If yes, the flow proceeds to PFA at block 314.

If no, the test model software 124 traces the current fault model diagnosed nets, and queries physical design database 118 for adjacent (but is not limited to adjacent) activated nets and cell aware information on failing and passing patterns at block 374.

At block 376, the test model software 124 generates a diagnostic fault list from each fault model 126 and the logic model, where the diagnostic fault list is for the diagnosed circuit and adjacent nets. At block 318, the test model software 124 generates N-detect test patterns 350 for each of the fault models 126.

There are many benefits of embodiments disclosed herein which include the following:

1) Being effective on un-modeled faults, AC faults, net-to-net defects, pattern sensitive faults, etc.

2) Having functional versus structural test methodology convergence.

3) Providing at-the-tester dynamically generated perturbed pattern sets.

4) Being highly interactive and convergent.

Now referring to FIG. 4, a flow chart 400 of reducing the faults/failures to the predefined (desired) diagnostic resolution is depicted by using the adaptive fail device specific iterative process of the test model software 124 discussed in FIGS. 3A-3E. After the initial test, FIG. 4 illustrates an example of the test results 134 after a first pass, a second pass, and a third pass through the diagnostic iteration loop. Although the initial test and the three passes through the diagnostic iteration loop are discussed, it is appreciated that more or fewer than three passes through the diagnostic iteration loop may be executed.

During the initial test, the test model software 124 is configured to cause the test system 130 to apply the test patterns 122 to the device under test 132 (e.g., wafer 150), and the test results 134 of the initial test may form a device space 401. The device space 401 has an input side 402 and output side 404. The device space 401 represents the physical area of the DUT 132 (i.e., physical area on the wafer 150). The input side 402 represents test signals (of test patterns) entering the DUT 132, and the output side represents test signals exiting the DUT 132. Based on the results 134 of the initial test, the test model software 124 generates two regions (e.g., polygon regions) such as region 406 and region 408 in the device space 401. Each suspect region 406 and 408 includes one or more faults. The region 406 is bounded by boundary line 'aa' on two edges and is bounded by boundary line 'xx' on the other two edges, thus forming the shape of the region 406.

The boundary lines aa, bb, xx, yy (along with boundary lines cc, dd, ee, ww, vv, zz) are the boundary of the faults/failures for their respective physical regions 406, 408. No faults are outside of the respective boundary lines.

Figure 6:
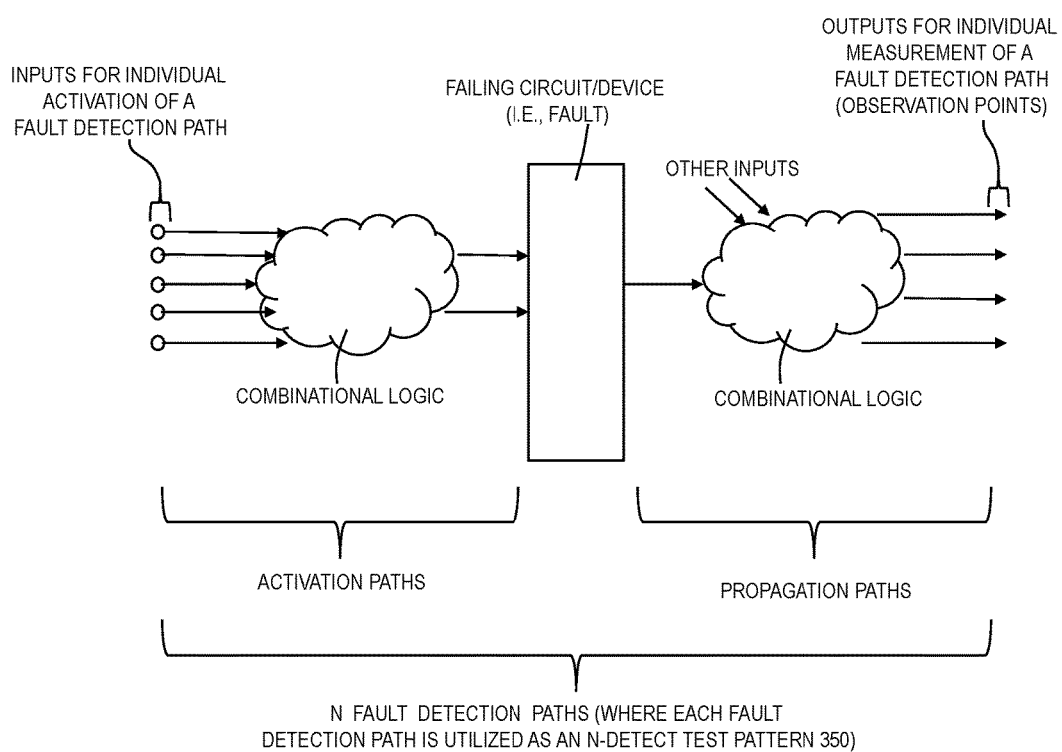
FIG. 6 depicts N fault detection paths that may be utilized as N-detect test patterns according to an embodiment.

After the initial test, the test model software 124 is configured to proceed through the first pass (e.g., block 310) to generate a set of N-detect patterns 350 (enhanced diagnostic patterns) that relate to the specific faults discovered in the regions 406 and 408 (in device space 401). The N-detect test patterns 350 are generated in real time or near real time in one implementation. As an example scenario, it is assumed that there may be 30 faults in the regions 406 and 408 combined. Each of the 30 faults may have numerous fault detection paths for each fault, where each fault detection path is for both activation and measurement of each fault. A fault detection path comprises an activation path and a propagation path. FIG. 6 depicts N fault detection paths that may be utilized as N-detect test patterns 350. An example failing circuit/circuit device is shown as the fault. Each individual fault detection path has its own activation path to the failing circuit/circuit device and propagation path for measurement.

On the input side (left side) of the failing circuit, there are multiple input paths into an input side cloud where the cloud represents combinational logic. The multiple input paths allow input for individual activation of a fault detection path. Then, the cloud (combinational logic) is input to each leg of the failing circuit.

Similarly, on the output side the of the failing circuit, output goes into an output side cloud where the cloud represents combinational logic, and the cloud may have many other inputs entering not related to the test pattern. Then, the output side cloud output goes into more than one observation point for measurement. The observation points are for individual measurement of a particular fault detection path.

An activation path is an electrical path that leads to a circuit device (failing circuit), such as a logic device (e.g., AND gate). An AND gate has two inputs on which a 0 (low) or 1 (high) can be applied. For each input on the AND gate, an activation path leads to that particular input (i.e., the activation path connects to the input such that a signal (0 or 1) can be applied to the AND gate). There can be numerous activation paths for each input to the AND gate (and any other logic gate), and each activation path may have other logic devices (in the input side cloud) on that activation path.

A propagation path is the electrical path leads from the output side of the failing circuit device to the measurement/observation point, such that the output of the circuit device (e.g., AND gate) is measured to determine if the output is correct. Before reaching the observation points, the electrical path may pass through logic devices (in the output side cloud). The propagation path allows the output of the circuit device to be captured to determine if the circuit device is failing (i.e., the fault).

The N-detect patterns 350 are generated to test certain fault detection paths that lead to and measure a certain fault, where the fault may be an AND gate (as well as other logic gates) producing the incorrect output.

N-detect test patterns may use more complex faults and/or generate a more complex and complete set of patterns not previously considered due to the sheer volume required of patterns needed to cover all of these complex scenarios on the entire design. The test model software uses the original test model and set of basic patterns and/or a combination of the original set and the new iterative pattern sets. This iteration continue to reduce the size of the test model to a narrower tested region of the original design and the previously modeled, activated, and partially isolated paths.

Moreover, N-detect is where the test model software 124 is testing (via the test system 130) the fault using N different fault detection paths until the desired diagnostic resolution. Typically, there is more than one path through the logic to test a fault. To test a fault, the fault detection path includes the activation and propagation to the observation point which is the measure point where the fault behavior will be observed. The methodology of the test model software 114 knows that different N-detect fault detection paths are to be utilized during each iteration to test the fault. Each fault has its own set of fault detection paths that include each path's activation and propagation conditions as well as its own observation points.

Referring to FIG. 4, the N-detect patterns 350 are configured to test the fault detection paths for the faults in regions 406 and 408. During the first pass, the test model software 124 is configured to cause the test system 130 to apply the N-detect patterns 350 to the device under test 132 (e.g., wafer 150) (e.g., block 322), and the updated test results 134 are displayed in the device space 401 representing the physical area of the DUT 132 (i.e., physical area on the wafer 150) (e.g., block 324). Based on the test results 134 of the first pass, the test model software 124 generates a smaller region 410 within the regions 406 and 408. The suspect region 410 includes a fewer number of faults (e.g., 15 faults) than the regions 406 and 408 combined (which may include 30 or more faults). The smaller region 410 is bounded by boundary line cc on two edges and is bounded by boundary line ww on the other two edges, thus forming the shape of the region 410.

After the first pass, the test model software 124 is configured to proceed through the second pass (e.g., block 310) to generate a set N-detect test patterns 350 (enhanced diagnostic patterns) that relate to the specific faults refined in the region 410 (in device space 401). The N-detect test patterns 350 are generated in real time or near real time in one implementation. It is assumed that there may be 15 faults in the region 410. Again, each of the 15 faults may have numerous fault detection paths that test each fault. The N-detect patterns 350 are generated to test certain activation paths that lead to certain (15) faults and propagation paths for measurement of each of the faults, where one fault may be an AND gate producing the incorrect output.

In one implementation, the test model software 124 ensures that all the original activation and propagation paths are traced back and uses the original test model controls, failing fault detection paths simulation, and observation points but uses the additional simulation values and combinations along with new complex fault models in and around these fault detection paths to test a diagnostic scenario. Once the simulation has better localized the fault in the same region using the same fault detection paths, the N-detect set of patterns are created.

The N-detect test patterns 350 are configured to test the fault detection paths for the faults in region 410. During the second pass, the test model software 124 is configured to cause the test system 130 to apply the (latest) N-detect patterns 350 to the device under test 132 (e.g., wafer 150) (e.g., block 322), and the updated test results 134 are displayed in the device space 401 representing the physical area of the DUT 132 (i.e., physical area on the wafer 150) (e.g., block 324). Now, based on the test results 134 of the second pass, the test model software 124 generates an even smaller region 412 within the region 410 (which is within the regions 406 and 408). The suspect region 412 includes a fewer number of faults (e.g., 5 faults) than the region 410. The even smaller region 412 is bounded by boundary line dd on two edges and is bounded by boundary line vv on the other two edges, thus forming the shape of the region 412.

After the second pass, the test model software 124 is configured to proceed through the third pass (e.g., block 310) to generate yet another set of N-detect patterns 350 (enhanced diagnostic patterns) that relate to the specific faults refined in the region 412 (in device space 401). The N-detect patterns 350 are generated in real time or near real time in one implementation. Now, it is assumed that there may be 5 faults in the region 412. Again, each of the 5 faults may have numerous fault detection paths that activate and measure each fault. The N-detect patterns 350 are generated to test certain fault detection paths that test certain (5) faults, where, e.g., one of the faults may be an AND gate producing the incorrect output.

At this point, the latest N-detect patterns 350 are configured to test the fault detection paths for the faults in region 412. During the third pass, the test model software 124 is configured to cause the test system 130 to apply the (latest) N-detect patterns 350 to the device under test 132 (e.g., wafer 150) (e.g., block 322), and the updated test results 134 are displayed in the device space 401 representing the physical area of the DUT 132 (i.e., physical area on the wafer 150) (e.g., block 324). Based on the test results 134 of the third pass (iteration), the test model software 124 generates yet an even smaller region 414 within the region 412 (which is within the regions 406, 408, 410). The suspect region 414 includes a fewer number of faults (e.g., 1 fault) than the earlier region 412. The yet even smaller region 414 is bounded by boundary line ee on two edges and is bounded by boundary line zz on the other two edges, thus forming the shape of the region 414.

In this example scenario, the third pass represents the last iteration of the diagnostic iteration loop in FIG. 3 because the desired diagnostic resolution is found by the test software 124 (e.g., block 312). It is assumed in this example that the desired diagnostic resolution is 1 fault (or a particular size such as X square centimeters) on the wafer 150 (DUT 132). The desired diagnostic resolution may be any predefined number of faults and/or predefined size. In FIG. 4, the localized fault 414 is a particular localized area on the wafer 150 which may correspond to a grid representation having an x, y, z axis as understood by one skilled in the art. The physical failure analysis can then use the x, y, z coordinates of the localized fault 414 to disassemble the wafer 150 and to visually observe the one or more faults in the localized fault region 414.

It is noted that the test model software 124 is configured use different fault detection paths (in the N-detect test patterns 35) that was previously used. The test model software 124 may create another N-detect test pattern that exercises the target fault but does so using a different fault detection path than previously used.

FIGS. 5A and 5B together are a flow chart 500 of method for an interactive logic diagnostic process according to an embodiment. At block 505, the test model software 124 is configured to apply test patterns 122 to a device under test 132 (e.g., wafer 150) via test system 130 in order to generate results 134 of the test patterns 122.

At block 510, the test model software 124 is configured to determine that a critical failure has occurred in the device under test 134 from the results 134.

At block 515, the test model software 124 is configured to perform a diagnostic iteration loop in conjunction with the simulation software 114. The test model software 124 is configured to check whether the critical failure has a diagnostic resolution that meets a predefined diagnostic resolution for physical failure analysis at block 520. At block 525, in response to the critical failure not having the diagnostic resolution that meets the predefined diagnostic resolution for physical failure analysis, the test model software 124 is configured to isolate potential faults related to the critical failure. At block 530, in response to the critical failure having the diagnostic resolution that meets the predefined diagnostic resolution for physical failure analysis, the test model software 124 is configured to end the diagnostic iteration loop.

At block 535, the test model software 124 is configured to generate path focused fault test patterns 350. At block 540, the test model software 124 is configured to apply the path focused fault test patterns 350 to the device under test 132 in order to generate updated results 134 of the path focused fault test patterns 350, such that the diagnostic resolution has been increased because of at least one of a number of the potential faults related to the critical failure has decreased, and/or a size of the physical area of the potential faults related to the critical failure has decreased. At block 545, the test model software 124 is configured to return to performing the diagnostic iteration loop.

Performing the diagnostic iteration loop is repeated until the critical failure has the diagnostic resolution that meets the predefined diagnostic resolution for physical failure analysis.

Generating the path focused fault test patterns 350 comprises identifying fault detection paths to the potential faults and selecting a subset of the fault detection paths to the potential faults. Applying the pathfocused fault test patterns 350 to the device under test 132 comprises using the subset of the fault detection paths.

Using the subset of the fault detection paths when performing each iteration of the diagnostic iteration loop causes the at least one of the number of the potential faults related to the critical failure to decrease, and/or the size of the physical area of the potential faults related to the critical failure to decrease. For each iteration of performing the diagnostic iteration loop, the subset of the fault detection paths is selected for the at least one of the number of the potential faults that has decreased and/or the size of the physical area of the potential faults that has decreased.

The path focused test patterns 350 may be generated from one or more fault models.

Technical effects and benefits include improved integrated circuits on a wafer. The improved integrated circuit improves a computer processor.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non- exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for testing an integrated circuit, the method comprising:
   executing test patterns on the integrated circuit in order to generate results;
   determining that a critical failure has occurred in the integrated circuit from the results in which the critical failure does not have a diagnostic resolution that meets a predefined diagnostic resolution; and
   in response to the critical failure not meeting the predefined diagnostic resolution, executing path focused fault test patterns on the integrated circuit in order to generate updated results, the updated results defining that that the diagnostic resolution has been increased based on a selection from the group consisting of: a decrease in a number of potential faults related to the critical failure, and a decrease in a size of a physical area of the potential faults related to the critical failure.

2. The method of claim 1, wherein executing the path focused fault test patterns on the integrated circuit in order to generate the updated results is repeated until the critical failure has the diagnostic resolution that meets the predefined diagnostic resolution for physical failure analysis.

3. The method of claim 1, wherein the path focused fault test patterns are generated by identifying fault detection paths for testing the potential faults.

4. The method of claim 3, wherein the path focused fault test patterns are generated by further selecting a subset of the fault detection paths to the potential faults.

5. The method of claim 4, wherein executing path focused fault test patterns on the integrated circuit in order to generate updated results comprises using the subset of the fault detection paths.

6. The method of claim 5, wherein using the subset of the fault detection paths causes the selection from the group consisting of: the decrease in the number of the potential faults related to the critical failure, and the decrease in the size of the physical area of the potential faults related to the critical failure.

7. The method of claim 1, wherein the path focused test patterns are generated from one or more fault models.

8. The method of claim 1, wherein the path focused test patterns are configured to utilize one or more activation paths of the integrated circuit.

9. The method of claim 8, wherein the one or more activation paths is an electrical path on an input side of a component in the integrated circuit.

10. The method of claim 1, wherein the path focused test patterns are configured to utilize one or more propagation paths.

11. The method of claim 10, wherein the one or more propagation paths is an electrical path on an output side of a component in the integrated circuit.

12. A computer program product for testing an integrated circuit, the computer program product comprising:
   a computer readable storage medium having program instructions embodied therewith, the program instructions readable by a processing circuit to cause the processing circuit to perform a method comprising:
   executing test patterns on the integrated circuit in order to generate results;
   determining that a critical failure has occurred in the integrated circuit from the results in which the critical failure does not have a diagnostic resolution that meets a predefined diagnostic resolution; and
   in response to the critical failure not meeting the predefined diagnostic resolution, executing path focused fault test patterns on the integrated circuit in order to generate updated results, the updated results defining that that the diagnostic resolution has been increased based on a selection from the group consisting of: a decrease in a number of potential faults related to the critical failure, and a decrease in a size of a physical area of the potential faults related to the critical failure.

13. The computer program product of claim 12, wherein executing the path focused fault test patterns on the integrated circuit in order to generate the updated results is repeated until the critical failure has the diagnostic resolution that meets the predefined diagnostic resolution for physical failure analysis.

14. The computer program product of claim 12, wherein the path focused fault test patterns are generated by identifying fault detection paths for testing the potential faults.

15. The computer program product of claim 14, wherein the path focused fault test patterns are generated by further selecting a subset of the fault detection paths to the potential faults.

16. The computer program product of claim 15, wherein executing path focused fault test patterns on the integrated circuit in order to generate updated results comprises using the subset of the fault detection paths.

17. The computer program product of claim 16, wherein using the subset of the fault detection paths causes the selection from the group consisting of: the decrease in the number of the potential faults related to the critical failure, and the decrease in the size of the physical area of the potential faults related to the critical failure.

18. The computer program product of claim 12, wherein the path focused test patterns are configured to utilize one or more activation paths of the integrated circuit.

19. The computer program product of claim 18, wherein the one or more activation paths is an electrical path on an input side of a component in the integrated circuit.

20. A computer system for testing an integrated circuit, the system comprising:
   a memory; and
   a processor, communicatively coupled to the memory, the computer system configured to perform a method comprising:
   executing test patterns on the integrated circuit in order to generate results;

determining that a critical failure has occurred in the integrated circuit from the results in which the critical failure does not have a diagnostic resolution that meets a predefined diagnostic resolution; and in response to the critical failure not meeting the predefined diagnostic resolution, executing path focused fault test patterns on the integrated circuit in order to generate updated results, the updated results defining that that the diagnostic resolution has been increased based on a selection from the group consisting of: a decrease in a number of potential faults related to the critical failure, and a decrease in a size of a physical area of the potential faults related to the critical failure.

* * * * *